United States Patent [19]
Widdershoven et al.

[11] Patent Number: 5,689,185
[45] Date of Patent: Nov. 18, 1997

[54] COMPACT DEVICE FOR MEASURING MAGNETIC FIELDS HAVING MAGNETORESISTORS AND AN AUXILIARY MAGNETIC FIELD GENERATOR

[75] Inventors: Franciscus P. Widdershoven; Gerjan F.A. Van De Walle, both of Eindhoven, Netherlands

[73] Assignee: U.S. Philips Corporation, New York, N.Y.

[21] Appl. No.: 389,361

[22] Filed: Feb. 16, 1995

[30] Foreign Application Priority Data

Feb. 28, 1994 [NL] Netherlands ............... 94200506.7

[51] Int. Cl.$^6$ .................. G01R 33/02; G01R 33/06; G01R 33/09
[52] U.S. Cl. ............... 324/252; 324/247; 338/32 R
[58] Field of Search .................... 324/252, 247, 324/249, 225; 338/32 R

[56] References Cited

U.S. PATENT DOCUMENTS

| | | | |
|---|---|---|---|
| 4,122,505 | 10/1978 | Kuijk | 324/252 |
| 5,255,442 | 10/1993 | Schierbeck et al. | 324/252 |

FOREIGN PATENT DOCUMENTS 0290811  11/1988  European Pat. Off. ........ G01R 33/02

OTHER PUBLICATIONS

Philips, Technical Publication No. 268, Jul.14, 1988.

*Primary Examiner*—Walter E. Snow
*Attorney, Agent, or Firm*—Robert J. Kraus

[57] ABSTRACT

A device for measuring magnetic fields comprises an assembly of at least two magnetic field sensors each of which comprises a number of magnetoresistive sensor elements situated in one plane and which have the same privileged directions of magnetization, said sensor elements being connected to a power supply circuit and to a signal processing circuit. The privileged directions of magnetization of the sensor elements of different magnetic field sensors are different. The assembly of magnetic field sensors is arranged within a magnetization coil made of a number of turns of an electric conductor extending around a central axis so as to generate an auxiliary magnetic field extending parallel to the central axis. The magnetic field sensors are arranged within the magnetization coil so that the angle enclosed by the central axis relative to the normal to the plane of the sensor elements is the same for each of the magnetic field sensors and the auxiliary magnetic field at the area of each of the magnetic field sensors contains a component which is parallel to the privileged direction of magnetization of the sensor elements of the relevant magnetic field sensor. The sensor part formed by the magnetic field sensors and the magnetization coil is small and light because the direction of the auxiliary magnetic field encloses the same angle $\alpha$ relative to the privileged direction of magnetization of the sensor elements of each of the magnetic field sensors, where $0° < \alpha < 90°$.

14 Claims, 3 Drawing Sheets

COMPACT DEVICE FOR MEASURING MAGNETIC FIELDS HAVING MAGNETORESISTORS AND AN AUXILIARY MAGNETIC FIELD GENERATOR

BACKGROUND OF THE INVENTION

This invention relates to a device for measuring magnetic fields, comprising an assembly including of at least two magnetic field sensors, each of which comprises a number of magnetoresistive sensor elements which are situated in one plane and which have the same privileged directions of magnetization, said sensor elements being connected on the one side to a power supply circuit and on the other side to a signal processing circuit, the privileged directions of magnetization of the sensor elements of different magnetic field sensors being different, said assembly of magnetic field sensors being arranged within a magnetization coil which is formed as an electric conductor which extends around a central axis in a number of turns and which is arranged to generate an auxiliary magnetic field extending parallel to the central axis, the magnetic field sensors being arranged within the magnetization coil in such a manner that the angle enclosed by the central axis relative to the normal to the plane of the sensor elements is the same for each of the magnetic field sensors and that the auxiliary magnetic field at the area of each of the magnetic field sensors contains a component which extends parallel to the privileged direction of magnetization of the sensor elements of the relevant magnetic field sensor.

A device of this kind is known from Philips Technical Publication 268. In one embodiment of the known device the magnetization coil is connected to a current pulse generator which is arranged to supply the magnetization coil with current pulses of opposite current direction in an alternating fashion, the arrangement being such that each current pulse generates a magnetic field in the magnetization coil which extends parallel to the privileged directions of magnetization of the sensor elements and which is strong enough to reverse the direction of the internal magnetization of the sensor elements. The reversal of the internal magnetization of the sensor elements serves to eliminate effects disturbing the measurement, for example, as caused by manufacturing tolerances and by drift due to temperature variations. The assembly of the known device may comprise two magnetic field sensors which are mounted perpendicularly to one another, as shown in FIG. 28 of the cited publication, within a cylindrical magnetization coil. A first drawback of the known device consists in that it is not readily possible to mount a third magnetic field sensor so that the privileged direction of magnetization of the sensor elements of the third magnetic field sensor extends perpendicularly to that of the sensor elements of the first two magnetic field sensors. The auxiliary magnetic field would then extend perpendicular to the plane of the sensor elements of the third magnetic field sensor so that it would not have the desired effect. Therefore, a separate magnetization coil would be required for the third magnetic field sensor, which would make the device particularly voluminous and heavy. Nevertheless, it is often desirable to detect three mutually perpendicular components of a magnetic field. This is the case, for example, when the device is used in some magnetic compasses in which detection of the three components of the terrestrial magnetic field is desirable. If only two components of a magnetic field need be measured, the known device is suitable. However, it may then be objectionable that the magnetization coil is comparatively voluminous and heavy because it must enclose the entire volume defined by the mutually perpendicular magnetic field sensors. Consequently, the known device is not very well suitable for applications where at least the part containing the magnetic field sensor must be very small and light. An example of such an application is a compass in a vehicle, for example, a car. The device then serves to detect the direction of the horizontal components of the terrestrial magnetic field and it would be desirable to mount the magnetic field sensor outside the car body, because the car body generally comprises a large amount of iron and thus has a disturbing effect on the local terrestrial field. A suitable location for the sensor is, for example, the tip of an aerial mounted on the vehicle. However, the sensor and the magnetization coil connected thereto should then be extremely small and light. The associated circuits can then be accommodated within the vehicle so that they may be more voluminous and heavier.

SUMMARY OF THE INVENTION

It is an object of the invention to provide a device of the kind set forth in which, at least in the case of two magnetic field sensors, a substantially smaller and lighter magnetization coil can be used than in the known device and in which it is also possible to render the device suitable for the measurement of three mutually perpendicular magnetic field components without requiring an additional magnetization coil for that purpose. To achieve this, the device in accordance with the invention is characterized in that the direction of the auxiliary magnetic field encloses the same angle $\alpha$ relative to the privileged direction of magnetization of the sensor elements of each of the magnetic field sensors, where $0°<\alpha<90°$. As a result of the steps of the invention, the auxiliary magnetic field has a component parallel to the privileged direction of magnetization of each of the sensor elements, these components being equally large for all sensor elements. It is to be noted that a device for measuring magnetic fields by means of three magnetic field sensors in an auxiliary magnetic field generated by a single magnetization coil is known per se from EP-A-0 290 811. In the known device the magnetization coil is wound on a toroidal support provided with recesses for accommodating the magnetic field sensors, so that the auxiliary magnetic field extends parallel to the privileged direction of magnetization for each magnetic field sensor. The sensor part thus formed is comparatively voluminous and heavy.

A first embodiment of the device in accordance with the invention is characterized in that the assembly comprises two magnetic field sensors which are arranged in such a manner that their respective sensor elements are situated in the same plane or in mutually parallel planes and the privileged directions of magnetization of the sensor elements extend mutually perpendicularly and enclose an angle of 45° relative to the central axis. This embodiment is suitable for the measurement of two mutually perpendicular components of a magnetic field. Because the sensor elements of the two magnetic field sensors are situated in one plane or in mutually parallel planes, the assembly consisting of the two magnetic field sensors almost completely fills a very small, block-shaped volume. The magnetization coil may have a shape adapted to the shape of this volume so that it can be substantially smaller than the magnetization coil of the known device.

A second embodiment of the device in accordance with the invention is characterized in that the assembly comprises three magnetic field sensors which are mounted on three mutually perpendicular surfaces of a support, the plane of the sensor elements of each of the magnetic field sensors extending parallel to a respective one of the three surfaces, said support being arranged within the magnetization coil in a manner such that the normals to the three said surfaces enclose equal angles relative to the central axis. This embodiment enables measurement of three mutually perpendicular components of a magnetic field. Particularly simple mounting of the magnetic field sensors can be achieved in this embodiment by mounting the magnetic field sensors on first parts of a flexible foil of an electrically insulating material provided with electric conductor tracks which constitute connection conductors for connecting the sensor elements to the power supply circuit and to the signal processing circuit, the foil being folded about the support in a manner such that the first parts of the foil are arranged against said surfaces. The power supply and signal processing circuits can be provided on the foil itself, if desired. In many cases, however, it will be desirable to avoid increased weight and volume of the combination of magnetic field sensors and magnetization coil due to addition of further components. In a further embodiment said circuits can be readily mounted at some distance from the magnetic field sensors, which embodiment is characterized in that the foil also comprises a strip-shaped second part on which the conductor tracks continue and which projects from the magnetization coil.

The assembly formed by the three said magnetic field sensors can be very compact in an embodiment which is characterized in that the support is shaped as at least a part of a cube, so that the three said surfaces adjoin the same corner point of the cube, the central axis of the magnetization coil being coincident with a body diagonal of the cube which extends through said corner point. The weight can be further reduced when the support is bounded, at the side situated opposite said corner point, by a boundary surface which extends perpendicularly to said body diagonal. In the last two embodiments the assembly of magnetic field sensors can almost completely fill the interior of the magnetization coil if the magnetization coil is shaped as a right-angled prism having a cross-section in the form of an equilateral hexagon.

BRIEF DESCRIPTION OF THE DRAWING

These and other aspects of the invention will be described in detail hereinafter with reference to the accompanying, in which.

DESCRIPTION OF THE PREFERRED EMBODIMENTS

Figure 1:
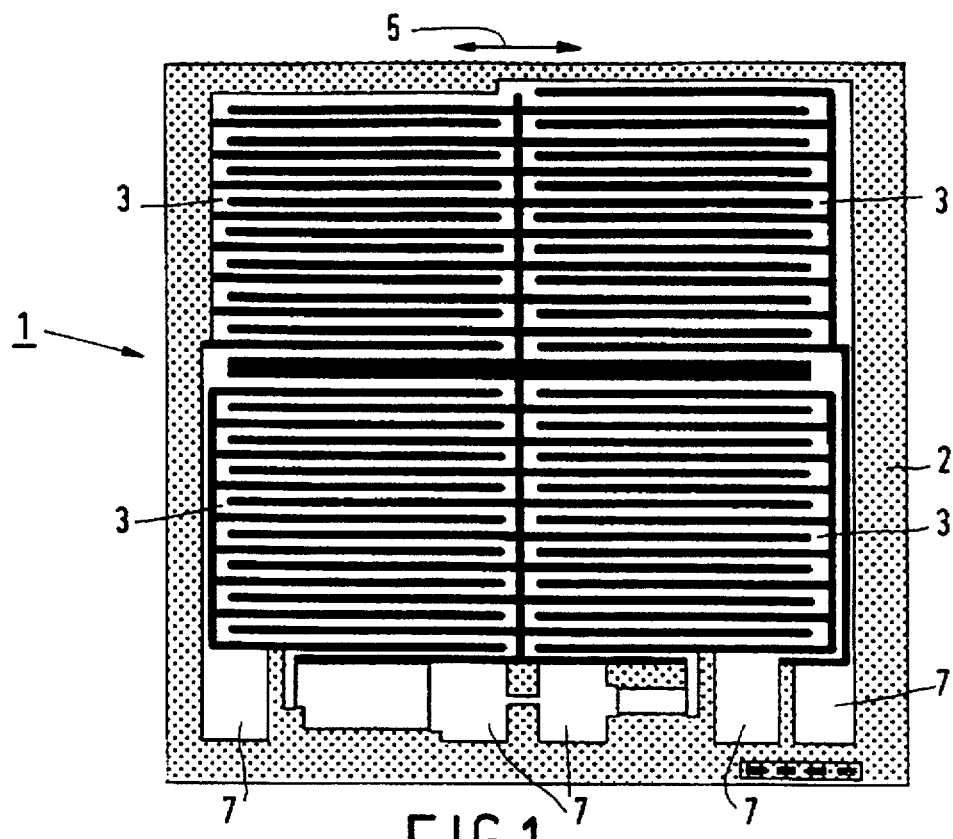
FIG. 1 is a plan view of a magnetic field sensor of a type suitable for use in the device in accordance with the invention.

FIG. 1 shows a magnetic field sensor 1 which is known per se and which is based on the magnetoresistive effect. This is the phenomenon that the electric resistance of a current-carrying magnetic material changes in the presence of an external magnetic field. This change is caused by a rotation of the magnetization relative to the current direction. For example, in the case of permalloy (a ferromagnetic alloy containing 20% iron and 80% nickel), a rotation of the magnetization through 90° (caused by an external magnetic field extending perpendicularly to the current direction) will cause a change in resistance of from 2 to 3%. In the magnetic field sensor shown (Philips type KMZ 10) four magnetoresistive sensor elements 3 are provided on a silicon substrate 2. Each of the sensor elements 3 is formed by a meander-like strip of permalloy having a privileged direction of magnetization parallel to the longitudinal direction of the strip, i.e. in the direction of the arrow 5. The ends of the sensor elements 3 are interconnected so that they form the four branches of a Wheatstone bridge. The degree of unbalance of the bridge can be used as a measure of the variation of the magnetic field strength in the plane of the sensor elements 3 and perpendicular to the direction of an electric current flowing through the sensor elements. The bridge circuit formed by the sensor elements 3 can be connected, via connection points 7, on the one side to a power supply circuit and on the other side to a signal processing circuit.

Figure 2:
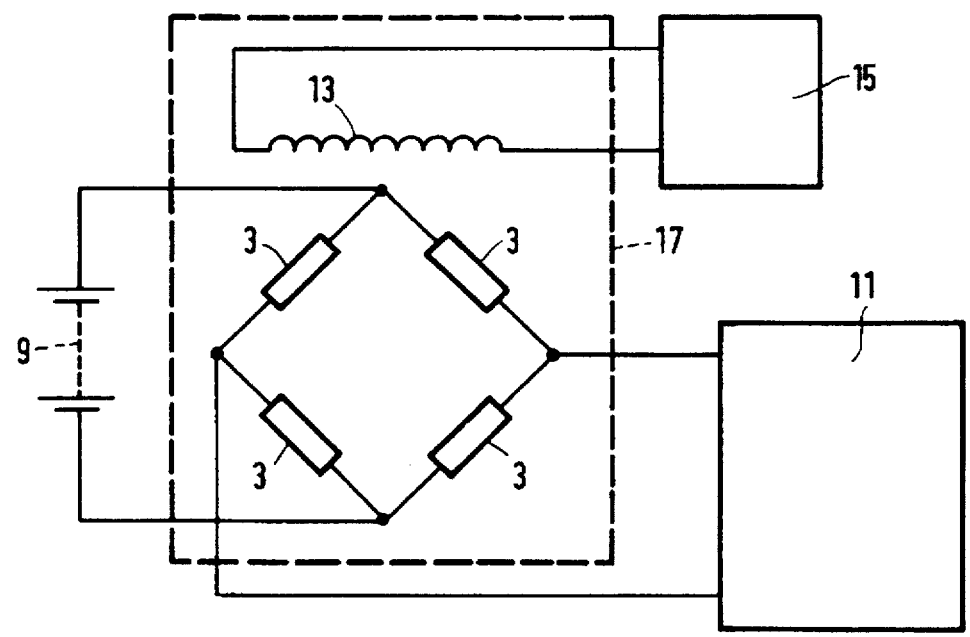
FIG. 2 is a partial block diagram of an embodiment of the device in accordance with the invention.

FIG. 2 shows a block diagram of an embodiment of a device for measuring magnetic fields in which a magnetic field sensor of the type shown in FIG. 1 is used. The bridge circuit formed by the sensor elements 3 is connected on the one side to a power supply circuit 9 (a battery in the present case) and to a signal processing circuit 11 on the other side. Examples of suitable signal processing circuits are described, for example, in the cited Philips Technical Publication 268. The cited publication also mentions that for the elimination of offset effects it is desirable to mount the magnetic field sensor in such a manner that the sensor elements 3 are subject to an auxiliary magnetic field generated by a magnetization coil 13. The magnetization coil 13 is connected to a current pulse generator 15 which is arranged to supply the magnetization coil 13 with current pulses of opposite current direction in an alternating fashion, so that oppositely directed auxiliary magnetic fields are alternately generated in the magnetization coil. The magnetization coil 13 is arranged in such a manner that the auxiliary magnetic fields generated in this coil extend parallel to the privileged direction of magnetization 5 of the sensor elements 3. The properties of the magnetization coil 13 and the current intensity supplied by the current pulse generator 15 are chosen so that the generated auxiliary magnetic fields are strong enough to reverse the direction of the internal magnetization of the sensor elements. For the sake of simplicity FIG. 2 shows only one magnetic field sensor. In the device in accordance with the invention, two or more magnetic field sensors are combined so as to form an assembly which constitutes a sensor part 17 in conjunction with a single magnetization coil 13. The auxiliary magnetic fields generated by the magnetization coil 13 contain components which extend parallel to the privileged directions of magnetization 5 of the sensor elements 3 of each magnetic field sensor. These components are all of the same magnitude.

Figure 3:
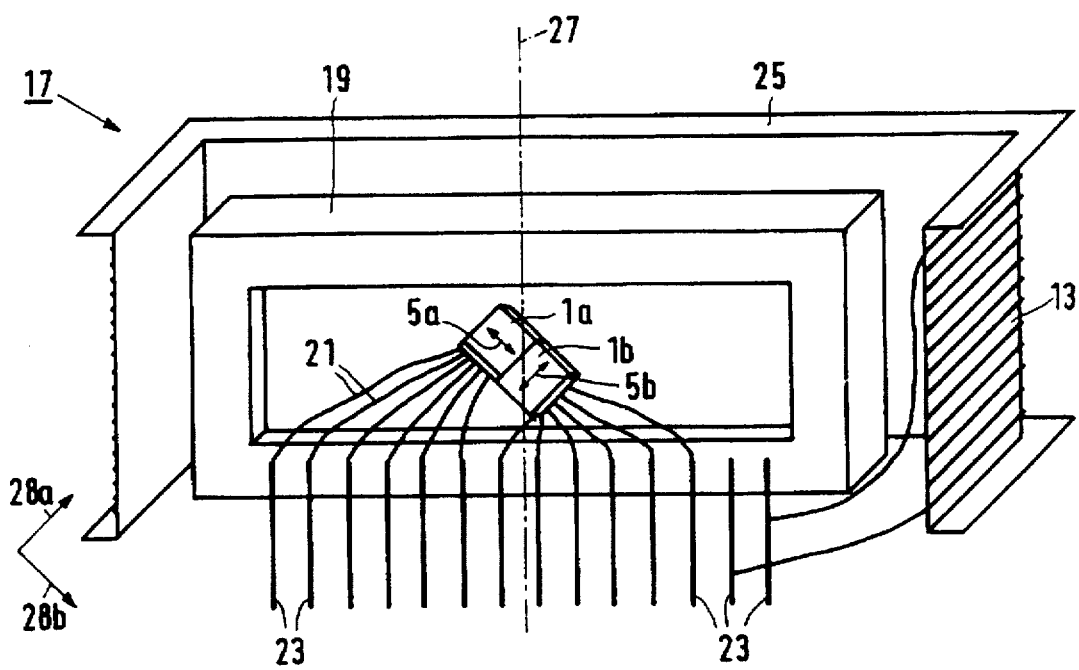
FIG. 3 is a perspective view of a first embodiment of a sensor part for the device in accordance with the invention.

FIG. 3 shows an embodiment of a sensor part 17 for a device capable of determining the magnitude and direction of two mutually perpendicular components of a magnetic field. A device of this kind can be used, for example, in a magnetic compass which is sensitive to the horizontal components of the terrestrial magnetic field. The sensor part 17 comprises an assembly of two magnetic field sensors 1a and 1b which are mounted together in a housing 19 of a non-magnetic material, for example a suitable synthetic material. The two magnetic field sensors 1a and 1b are mounted so that their sensor elements (not separately shown in FIG. 3) are situated in one plane and the privileged directions of magnetization 5a and 5b extend perpendicularly to one another. The sensor elements are connected to connection pins 23 of the housing 19 via connection wires 21. The housing 19 is enclosed by a coil former 25 of a synthetic material on which the magnetization coil 13 is wound. The magnetization coil 13 consists of an electrically conductive wire which extends around a central axis 27 in a number of turns, which central axis encloses an angle of 45° relative to each of the privileged directions 5a and 5b. The two ends of the wire constituting the magnetization coil 13 are connected to two of the connection pins 23. When an electric current is applied to the magnetization coil 13, an auxiliary magnetic field H is generated in this coil which extends parallel to the central axis 27 so that it encloses an angle of 45° relative to each of the privileged directions. As is known, the magnitude of a component $H(\alpha)$ in a direction enclosing an angle $\alpha$ relative to a magnetic field H equals $H\cos\alpha$. In the present case the magnitude of the component of the auxiliary magnetic field H extending parallel to the privileged directions 5a and 5b thus equals $H\cos 45° = \frac{1}{2}H\sqrt{2}$. Therefore, the strength of the auxiliary magnetic field H must be $\sqrt{2}$ times greater than the strength of an auxiliary magnetic field extending parallel to the privileged directions in order to obtain the same effect. This can be readily achieved by adaptation of the current intensity in the magnetization coil 13 or of the number of turns of this coil.

Because the two magnetic field sensors 1a and 1b are adjacently arranged in one plane, the thickness of the assembly (being the dimension in a direction perpendicular to said plane) is very small. Therefore, the thickness of the housing 19 may also be very small. The width of the housing 19 (being the dimension in a direction perpendicular to said direction and perpendicular to the central axis 27, i.e. from left to right in the Figure) is determined by the space required for the connection pins 23. The dimensions of the coil former 25 are chosen so that the housing 19 fits in the cavity of the coil former with a slight clearance. The space within the coil former 25 is thus very efficiently used and the complete sensor part 17 can be very small and light. This is also the case when the two magnetic field sensors 1a and 1b are not adjacently arranged but stacked with the privileged directions 5a and 5b oriented in the same way as in the Figure. In that case the planes of the sensor elements extend parallel to one another and the assembly will have a thickness which is larger and a width which is smaller than in the case shown. The cross-section of the housing 19 should then be more square and the connection pins 23 can then be arranged, for example, in two parallel rows. In both cases the sensor part is suitable for the measurement of two magnetic fields which are directed perpendicularly to the privileged directions 5a and 5b in the plane of the sensor elements, i.e. as denoted by the arrows 28a and 28b. These fields may be, for example, two components of the terrestrial magnetic field. If desired, other components such as, for example, an integrated circuit may also be accommodated in the housing 19.

Figure 4A:
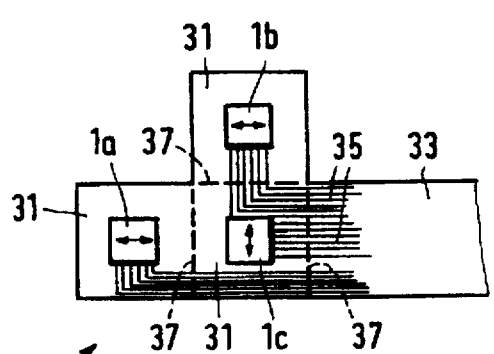
FIGS. 4a and 4b show a foil and a support, respectively, for a second embodiment of a sensor part for the device in accordance with the invention.

FIG. 4a is a plan view of a flexible foil 29 of an electrically insulating material, for example, Kapton, which comprises three first parts 31 and one second part 33. On a main surface of the foil 29 there are provided a number of electric conductor tracks 35 which are formed, for example, from a thin layer of copper as is customary in the manufacture of printed circuit boards. Each conductor track 35 starts on one of the first parts 31 and continues on the second part 33. The first parts 31 have a square shape and the second part 33 is strip-shaped. On each of the first parts 31 there is mounted a magnetic sensor 1a, 1b, 1c, respectively, the sensor elements (not separately shown in the Figure) being electrically connected to associated conductor tracks 35 which serve as connection conductors for connecting the sensor elements to external circuits.

Figure 4B:
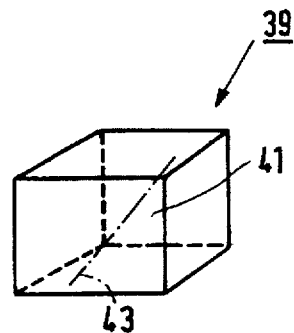

The shape of the foil 29 is chosen so that the foil can be folded along folding lines 37, denoted by dashed lines, in such a manner that the three first parts 31 are situated in mutually perpendicular planes. The three first parts 31 then correspond to three side faces of a cube which adjoin the same corner point of the cube. The foil 29 can thus be folded about a support 39 as shown in FIG. 4b. The support 39 is shaped as a cube and may be made, for example of a suitable synthetic material. The cube may be hollow or solid. The corner point adjoined by said three side faces is denoted by the reference 41 in FIG. 4b and a body diagonal of the cube which extends through the relevant corner point and which is represented by a dash-dot line is denoted by the reference 43. The body diagonal encloses equal angles relative to the normals to said three side faces.

Figure 5A:
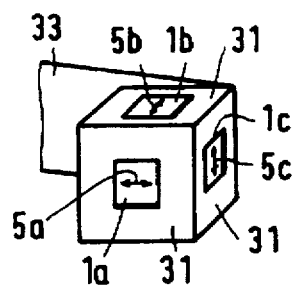
FIGS. 5a and 5b illustrate different stages of the manufacture of the second embodiment.

FIG. 5a is a perspective view of the semi-finished product obtained after the folding of the foil 29 about the support 39. The three first parts 31 contact three of the side faces of the support 39 and the second part 33 is folded back along a fourth side face. The conductor tracks 35 present on this part (not visible in FIG. 5a) can be connected, directly or via a connection cable (not shown), to the power supply circuit 9 and to the signal processing circuit 11 (FIG. 2). If desired, components associated with these circuits may be mounted directly on the second part 33. The privileged directions of magnetization 5a, 5b and 5c of the sensor elements of the three magnetic field sensors 1a, 1b and 1c enclose equal angles of 57.4° relative to the body diagonal 43 shown in FIG. 4b.

Figure 5B:
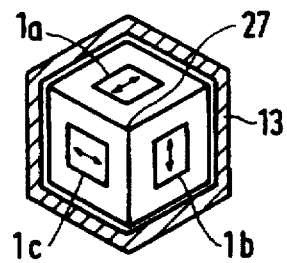

FIG. 5b is a front view of a sensor part manufactured by using the semi-finished product shown in FIG. 5a. To this end, the semi-finished product is arranged in a magnetization coil 13 in a manner such that the body diagonal 43 (FIG. 4b) coincides with the central axis 27 which extends perpendicularly to the plane of drawing in FIG. 5b. The direction of an auxiliary magnetic field generated by the magnetization coil 13 and extending parallel to the central axis 27 thus encloses an angle of 57.4° relative to each of the privileged directions 5a, 5b and 5c. The magnetization coil 13 of the present embodiment is shaped as a right-angled prism having a cross-section in the form of an equilateral hexagon. As appears from FIG. 5b, the projection of the cubic assembly of magnetic field sensors on a plane perpendicular to the central axis 27 (the plane of drawing) is also shaped as an equilateral hexagon. Thus, this assembly almost completely fills the space within the magnetization coil 13 so that the dimensions and the weight of the sensor part are minimized. If slightly larger dimensions and higher weight are acceptable, evidently the magnetization coil may also have a different shape, for example the shape of a right-angled circular cylinder. The second part 33 of the foil 29, not being visible in FIG. 5b, then projects from the magnetization coil 13.

Figure 6A:
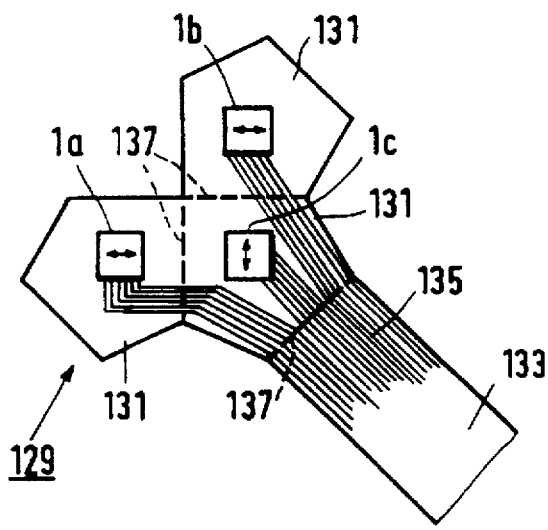
FIGS. 6a and 6b show a foil and a support, respectively, for a third embodiment of a sensor part for the device in accordance with the invention.
Figure 6B:
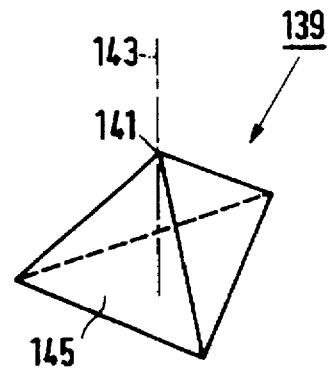

FIG. 6a is a plan view of a flexible foil 129 which resembles the foil 29 shown in FIG. 4a in many respects. The shape of the first parts 131 of the foil 129, however, deviates from that of the first parts 31 of the foil 29. The foil 129 is also provided with electric conductor tracks 135 which constitute connection conductors for the magnetic field sensors 1a, 1b and 1c to be mounted on the first parts 131. The foil 129 can be folded along dashed folding lines 137 in such a manner that the first parts 131 are situated in mutually perpendicular planes which adjoin one another in one point. The foil 129 can thus be folded about a support 139 which is shown in FIG. 6b and which is shaped as a pyramid having three mutually perpendicular faces which adjoin one another in a point 141 which constitutes the apex of the pyramid. From the point of view of geometry, these three faces correspond to three faces of a cube which adjoin one another in a corner point, the body diagonal of said cube being represented as a dash-dot line 143. The cube is cut off along a boundary face 145 which extends perpendicularly to the body diagonal 143 and constitutes the base of the pyramid.

Figure 7A:
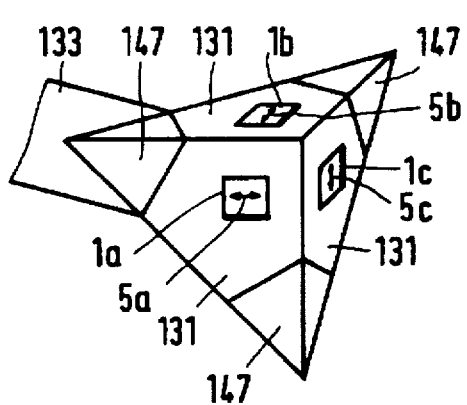
FIGS. 7a and 7b illustrate different stages of the manufacture of the third embodiment.

FIG. 7a is a perspective view of a semi-finished product obtained by folding the foil 129 about the support 139 in the indicated manner. The three first parts 131 are arranged against the side faces of the support 139 and the second part 133 is folded back along the base 145. The conductor tracks 135 provided on this part (not visible in FIG. 7a) can again be connected to the power supply circuit 9 and the signal processing circuit 11 (FIG. 2). The privileged directions of magnetization 5a, 5b and 5c of the sensor elements of the three magnetic field sensors 1a, 1b and 1c enclose equal angles of 57.4° relative to the body diagonal 143 shown in FIG. 6b.

Figure 7B:
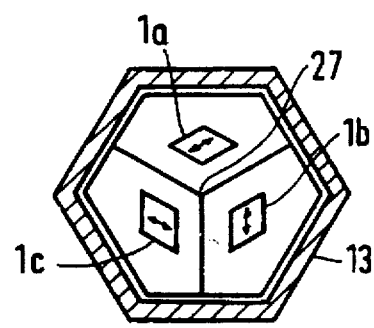

FIG. 7b is a plan view of a sensor part manufactured by means of the semi-finished product shown in FIG. 7a. To this end, the semi-finished product is arranged in a magnetization coil 13 in such a manner that the body diagonal 143 (FIG. 6b) coincides with the central axis 27 which extends perpendicularly to the plane of the drawing in FIG. 7b. The direction of an auxiliary magnetic field generated by the magnetization coil 13 and extending parallel to the central axis 27, therefore, encloses an angle of 57.4° relative to each of the privileged directions 5a, 5b and 5c. The magnetization coil 13 of this embodiment is again shaped as a right-angled prism having a cross-section in the form of an equilateral hexagon. In order to make the semi-finished product shown in FIG. 7a suitable for such a coil it is desirable to cut off the points 147 of the support 139 which extend beyond the first parts 131 of the foil 129. The support is thus shaped as a pyramid with truncated corner points. As in the embodiment shown in FIG. 5b, however, other shapes of the magnetization coil 13 are also feasible, it being permissible for the support 139 to be shaped as shown in FIG. 6b. As has already been stated, because of the small dimensions of the sensor part, the described device is particularly suitable for use in a magnetic compass for a vehicle, for example, a car, boat or aeroplane. Other feasible applications are, for example, a compass which is built into a watch (notably the version of, for example FIG. 7 which is sensitive to two magnetic field components), or a self-contained compass for use as a sporting or car accessory. Further feasible applications are terrestrial field compensation control systems for high-resolution image monitors and traffic control systems (for example, sensors embedded in road surfaces).

We claim:

1. A device for measuring magnetic fields, comprising: an assembly of at least two magnetic field sensors, each of which comprises a number of magnetoresistive sensor elements situated in one plane and which have the same privileged directions of magnetization, said sensor elements including means for connection to a power supply circuit and to a signal processing circuit, the privileged directions of magnetization of the sensor elements of the at least two magnetic field sensors being different, said assembly of magnetic field sensors being arranged within a magnetization coil comprising an electric conductor having a number of turns and which extends around a central axis and which is arranged to generate an auxiliary magnetic field extending parallel to the central axis, the magnetic field sensors being arranged within the magnetization coil in a manner such that the angle enclosed by the central axis relative to a normal to the plane of the sensor elements is the same for each of the magnetic field sensors and so that the auxiliary magnetic field at the area of each of the magnetic field sensors contains a component which extends parallel to the privileged direction of magnetization of the sensor elements of the relevant magnetic field sensor, wherein the direction of the auxiliary magnetic field encloses the same angle α relative to the privileged direction of magnetization of the sensor elements of each of the magnetic field sensors, where 0°<α<90°.

2. A device as claimed in claim 1, wherein the assembly comprises two magnetic field sensors which are arranged in a manner such that their respective sensor elements are situated in the same plane or in mutually parallel planes and the privileged directions of magnetization of the sensor elements extend mutually perpendicularly and enclose an angle of 45° relative to the central axis.

3. A device as claimed in claim 1, wherein the assembly comprises three magnetic field sensors which are mounted on three mutually perpendicular surfaces of a support, the plane of the magnet resistive sensor elements of each of the magnetic field sensors extending parallel to a respective one of the three surfaces, said support being arranged within the magnetization coil in a manner such that the normals to the three said surfaces enclose equal angles relative to the central axis.

4. A device as claimed in claim 3, wherein the magnetic field sensors are mounted on first parts of a flexible foil of an electrically insulating material provided with electric conductor tracks, the conductor tracks constituting connection conductors for connecting the sensor elements to the power supply circuit and to the signal processing circuit, the foil being folded about the support in a manner such that the first parts of the foil are arranged against said surfaces.

5. A device as claimed in claim 4, wherein the foil also comprises a strip-shaped second part on which the conductor tracks continue and which projects from the magnetization coil.

6. A device as claimed in any one of the claims 3 to 5, wherein the support is shaped as at least a part of a cube, so that the three said surfaces adjoin the same corner point of the cube, the central axis of the magnetization coil being coincident with a body diagonal of the cube which extends through said corner point.

7. A device as claimed in claim 6, wherein the support is bounded, at the side situated opposite said corner point, by a boundary surface which extends perpendicularly to said body diagonal.

8. A device as claimed in claim 7, wherein the magnetization coil is shaped as a right-angled prism having a cross-section in the form of an equilateral hexagon.

9. A device as claimed in claim 6, wherein the magnetization coil is shaped as a right-angled prism having a cross-section in the form of an equilateral hexagon.

10. A magnetoresistive device comprising:
first and second magnetic field sensors each of which comprises a plurality of magnetoresistive sensor elements connected together to form respective Wheatstone bridge circuits and each situated in one plane, and wherein the magnetoresistive sensor elements of each magnetic field sensor have the same privileged direction of magnetization with the privileged direction of magnetization of the first magnetic field sensor being different from that of the second magnetic field sensor, a magnetization coil magnetically coupled to said first and second magnetic field sensors to produce an auxiliary magnetic field parallel to a central axis thereof and positioned such that an angle enclosed by the central axis relative to a normal to the plane of the sensor elements is the same for each of the magnetic field sensors and so that the auxiliary magnetic field at the area of each of the magnetic field sensors contains a component which extends parallel to the privileged direction of magnetization of the sensor elements of the relevant magnetic field sensor, wherein the direction of the auxiliary magnetic field encloses the same angle $\alpha$ relative to the privileged direction of magnetization of the sensor elements of each of the magnetic field sensors, where $0°<\alpha<90°$, and means for coupling the Wheatstone bridge circuits to a source of supply voltage and to a signal processing circuit.

11. A magnetoresistive device as claimed in claim 10 wherein the magnetic field sensors are arranged so that the magnetoresistive sensor elements of the first and second magnetic field sensors are situated in the same plane or in two mutually parallel planes with the privileged direction of magnetization of the first magnetic field sensor being perpendicular to that of the second magnetic field sensor, and each privileged direction of magnetization forms an angle of 45° relative to the central axis.

12. A magnetoresistive device as claimed in claim 10 further comprising:

a third magnetic field sensor which comprises a plurality of magnetoresistive sensor elements connected together to form a Wheatstone bridge circuit and situated in one plane, and wherein the magnetoresistive sensor elements of the third magnetic field sensor have the same privileged direction of magnetization, and said privileged direction of magnetization is different from that of the first and second magnetic field sensors, and wherein the first, second and third magnetic field sensors are mounted to be mutually perpendicular and relative to the magnetization coil such that respective normals to the planes of said first, second and third magnetic field sensors form equal angles relative to the central axis.

13. A magnetoresistive device as claimed in claim 12 wherein the magnetic field sensors are mounted on a flexible foil of electric insulating material with the foil being folded about a support so that the planes of the first, second and third magnetic field sensors are mutually perpendicular.

14. A magnetoresistive device as claimed in claim 12 wherein the magnetic field sensors are mounted on a flexible foil of electric insulating material with the foil being folded about a support shaped as at least a part of a cube and with the planes of the first, second and third magnetic field sensors being mutually perpendicular and the central axis of the magnetization coil being coincident with a diagonal of the cube which extends through a corner point of said cube.

* * * * *